US009478447B2

(12) United States Patent
Cuvalci et al.

(10) Patent No.: US 9,478,447 B2
(45) Date of Patent: Oct. 25, 2016

(54) SUBSTRATE SUPPORT WITH WIRE MESH PLASMA CONTAINMENT

(71) Applicant: APPLIED MATERIALS, INC., Santa Clara, CA (US)

(72) Inventors: Olkan Cuvalci, Sunnyvale, CA (US); Gwo-Chuan Tzu, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 826 days.

(21) Appl. No.: 13/684,672

(22) Filed: Nov. 26, 2012

(65) Prior Publication Data

US 2014/0144901 A1   May 29, 2014

(51) Int. Cl.
 *H05B 3/06* (2006.01)
 *H01L 21/67* (2006.01)
 *H05B 3/28* (2006.01)

(52) U.S. Cl.
 CPC ......... *H01L 21/67103* (2013.01); *H05B 3/283* (2013.01)

(58) Field of Classification Search
 CPC .................. H05B 3/283; H01L 21/67103
 USPC ............ 219/221, 448.18, 462.1; 156/345.28, 156/345.34, 345.43, 345.51
 See application file for complete search history.

(56) References Cited

U.S. PATENT DOCUMENTS

| 2004/0250955 | A1* | 12/2004 | Blonigan | H01J 37/32577 156/345.51 |
| 2006/0272774 | A1* | 12/2006 | Maehara | H01L 21/68757 156/345.28 |
| 2007/0234960 | A1* | 10/2007 | Honda | C23C 16/4401 118/723 E |
| 2008/0035306 | A1* | 2/2008 | White | C23C 16/4586 165/61 |
| 2009/0031955 | A1* | 2/2009 | Lu | C23C 16/4584 118/728 |

* cited by examiner

*Primary Examiner* — Thien S Tran
(74) *Attorney, Agent, or Firm* — Moser Taboada; Alan Taboada (57) ABSTRACT

Embodiments of substrate supports having a wire mesh plasma containment are provided herein. In some embodiments, a substrate support may include a plate comprising a first surface, an opposing second surface, a thickness bounded by the first and second surfaces, and a first perimetrical surface; a first heater element disposed between the first and second surfaces; a wire mesh disposed between the first and second surfaces; a ground connector mounted to a surface of the plate; at least one electrical connection between the wire mesh and the ground connector; and an elongate shaft comprising a first end and an opposite second end, wherein the plate second surface is mounted to the first end of the shaft.

16 Claims, 5 Drawing Sheets

SUBSTRATE SUPPORT WITH WIRE MESH PLASMA CONTAINMENT

FIELD

Embodiments of the present invention generally relate to semiconductor processing equipment.

BACKGROUND

Atomic layer deposition (ALD) and chemical vapor deposition (CVD) are two exemplary methods used in semiconductor fabrication to deposit thin films on a substrate. ALD and CVD processes generally include introducing a process gas to a process chamber in which a substrate, such as a semiconductor wafer, is supported on a substrate support. The substrate support may be fabricated from suitable metallic materials, such as aluminum or stainless steel, or suitable non-metallic materials, such as ceramic, and may contain one or more heating elements to create one or more heating zones in the support.

In some processes, energy is supplied to the process gas to form a plasma over the substrate. The plasma contains dissociated and ionized components as well as neutral components that operate to assist the process being performed on the substrate (such as ALD, CVD, etching, and the like). Although the constituents of the plasma are beneficial for assisting or carrying out the process on the substrate, unconstrained plasma components may impinge on the substrate and/or chamber components causing damage. In addition, plasma non-uniformities may lead to non-uniform processing of substrates.

Heated ceramic substrate supports or plates have been found useful in at least ALD and CVD processing. Among the features of ceramic plates are the ability to sinter the plate with various elements contained inside the plate. For example, heater elements can be provided in the plate, and the plate may be sintered with a plasma-containing wire mesh (i.e., a mesh with characteristics conducive to containing plasma) in the plate. Conventional ceramic heater plates with plasma containing mesh ground the mesh with one rod centrally brazed to the mesh.

The one-point grounding method used in conventional ceramic heater plates may create sufficient plasma uniformity for low frequency (less than 13.56 MHz) applications. However, the inventors have observed that in high frequency plasma applications (e.g., at frequencies greater than about 13.56 MHz), the single point grounding of the mesh is insufficient to create uniform plasma.

SUMMARY

Embodiments of substrate supports having a wire mesh plasma containment are provided herein. In some embodiments, a substrate support may include a plate comprising a first surface, an opposing second surface, a thickness bounded by the first and second surfaces, and a first perimetrical surface; a first heater element disposed between the first and second surfaces; a wire mesh disposed between the first and second surfaces; a ground connector mounted to a surface of the plate; at least one electrical connection between the wire mesh and the ground connector; and an elongate shaft comprising a first end and an opposite second end, wherein the plate second surface is mounted to the first end of the shaft.

In some embodiments, the ground connectors may comprise one or more annular ground plates affixed or mounted to the second or bottom surface of the plate. In other embodiments, one or more ground connectors comprising an annular ring or an annular segment are affixed or mounted to a perimetrical surface of the plate.

Advantageously, the heater plate may be sintered, for example from ceramic powder, as a single or monolithic piece. In some embodiments, the heater or heaters, the wire mesh, or both the heater(s) and the wire mesh may be sintered in place in the heater plate, eliminating assembly steps in some known heater plates.

The substrate support may be disposed in a process chamber and the ground connectors may be electrically connected to an electrical ground provided by one or more components of the process chamber according to some embodiments.

In some embodiments, a method for forming a ceramic heater plate for a substrate support may include providing an sintering mold with a cavity appropriately configured to form a ceramic heater plate; placing at least one heater element in the mold; placing at least one plasma containing wire mesh in the mold; placing a sufficient amount of at least ceramic powder in the mold; subjecting the mold to a pressing process to form a green body; sintering the green body in a sintering furnace; and removing the monolithic sintered ceramic heater plate from the furnace.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of substrate supports for supporting a substrate during plasma assisted semiconductor fabrication are disclosed herein. Embodiments may provide improved plasma containment to a desired volume above the substrate. Furthermore, substrate supports in accordance with embodiments disclosed herein may provide greater ease in manufacturing and assembly and improved performance and durability in operation.

Figure 1:
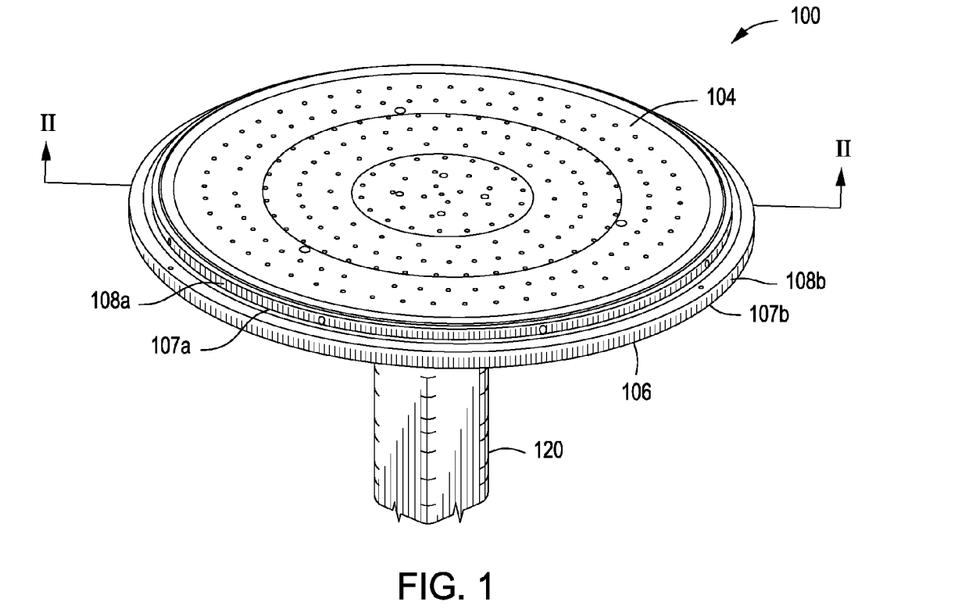
FIG. 1 depicts a perspective view of a ceramic heater pedestal in accordance with some embodiments of the present invention.

FIG. 1 depicts a substrate support 100 in accordance with some embodiments of the present invention. The substrate support 100 comprises a heater plate or plate 102 and a shaft 120 affixed to the plate 102. Plate 102 comprises a substantially planar top or first surface 104, an opposing substantially planar bottom or second surface 106, and a thickness t measured generally perpendicularly to the surfaces.

Figure 2A:
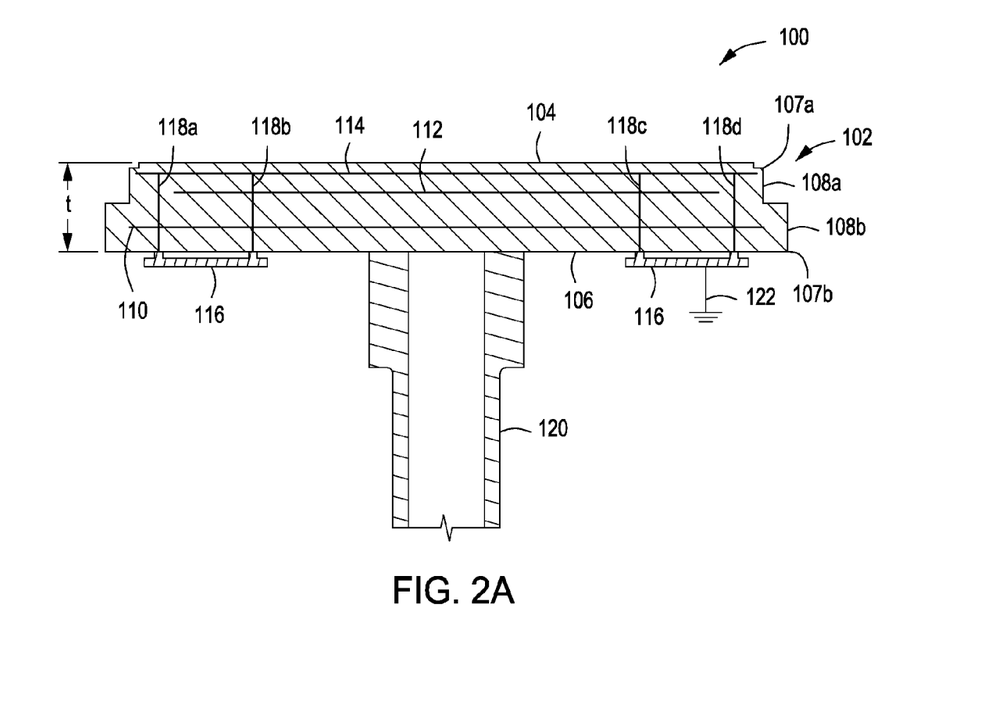
FIG. 2A depicts a sectional view of the ceramic heater pedestal of FIG. 1 taken along line II-II in accordance with some embodiments of the present invention.

FIG. 2A depicts a substrate support 100 in accordance with some embodiments of the present invention. The substrate support 100 comprises a heater plate or plate 102 and a shaft 120 affixed to the plate. Plate 102 comprises a substantially planar top or first surface 104, an opposing substantially planar bottom or second surface 106, and a thickness t measured generally perpendicularly to the surfaces.

In some embodiments, the plate 102 has a stepped edge configuration and comprises more than one perimeter and more than one perimetrical surface. As illustrated, the plate 102 comprises a first plate perimeter 107a and an associated first perimetrical surface 108a bounding plate first surface 104, and a second plate perimeter 107b having a larger radius than the first plate perimeter 107a and an associated second perimetrical surface 108b bounding plate second surface 106. Substrate supports or plates for substrate supports having more than two perimeters, or with only one perimeter, are within the scope of this disclosure.

A first heater element 110 is disposed within the thickness t of the plate 102. In addition to the first heater element 110, additional heater elements, for example a second heater element 112 may be included. A wire mesh 114 may also be disposed in the thickness of the heater plate, and may be disposed adjacent to the first surface 104 of the plate 102.

The plate 102 may be fabricated using processes known in the ceramic arts, for example sintering. In the sintering process, a ceramic powder with additional materials as necessary, are placed in a mold and pressed in one or more steps to fuse the ceramic powder particles together into a ceramic article. During the sintering process, elements can be placed within the mold along with the ceramic powder to advantageously provide the elements in a predictable location within the final sintered article.

For example, the heater elements 110, 112 or the wire mesh 114 may be placed within the mold with the ceramic powder prior to sintering. The heater elements or wire mesh may be fixtured within the mold for proper placement. The ceramic powder is introduced to the mold, the mold is closed and subjected to sintering conditions in accordance with good sintering practice. At the end of the sintering process, the sintered heater plate contains the heater elements and the wire mesh in the desired locations.

As illustrated in FIG. 2A, the first heater element 110, the second heater element 112 and the wire mesh 114 are embedded in the heater plate 102. In the configuration illustrated, first heater element 110 is located closest to the second surface 106. The second heater element 112 is spaced apart from the first heater element 110 in a direction towards the first surface 104, and wire mesh 114 is located between the second heater element 112 and the first surface 104. Other orientations of the heater elements 110, 112 and the wire mesh 114 may be suitable for certain processes or process parameters.

At least one ground connector 116 is mounted to the plate second surface 106 and may be so mounted using suitable techniques, for example, threaded fasteners, clamps, or bonding methods. For example, connectors, such as nuts or other threaded members, may be brazed to the second surface 106 and the ground connector 116 may be bolted to the threaded members to couple the ground connector 116 to the plate second surface 116. As shown, the ground connector 116 is a continuous planar structure, for example an annular structure, and may be a ground plate. More than one ground connector 116 may be provided on the second surface 106. The ground connectors may be continuous structures, such as annular rings spaced apart radially, or the ground connectors may be individual structures, for example segments of an annular ring, or structures of different shapes.

Each ground connector 116 has at least one electrical connection with the wire mesh 114. As illustrated in the non-limiting embodiment of FIG. 2A, the ground connector comprises four electrical connections, indicated schematically by 118a-118d. In other embodiments, fewer than four connections may be provided. In still other embodiments, more than four connections may be provided, for example 12 or 24 electrical connections between the wire mesh 114 and the one or more ground connectors 116 may be provided.

Electrical connections (for example 118a-118d) provide electrical connectivity between the wire mesh 114 and the ground connectors 116, and may be formed from appropriate electrically conductive materials, for example, aluminum, stainless steel, or nickel-based alloys, such as Hastelloy®.

At a first end adjacent to the wire mesh 114, each electrical connection (e.g., 118a-118d) is electrically connected to the wire mesh 114, as in a non-limiting example, by brazing. The second opposite end of each electrical connection is electrically connected to one of the one or more ground connectors 116, as in non-limiting examples by brazing or through a mechanical connection, for example a crimped connection or with a threaded fastener.

Ground connectors 116 may be electrically connected to an electrical ground, schematically illustrated in FIG. 2A as 122. One or more connections to ground 122 may be provided for each ground connector 116.

Figure 2B:
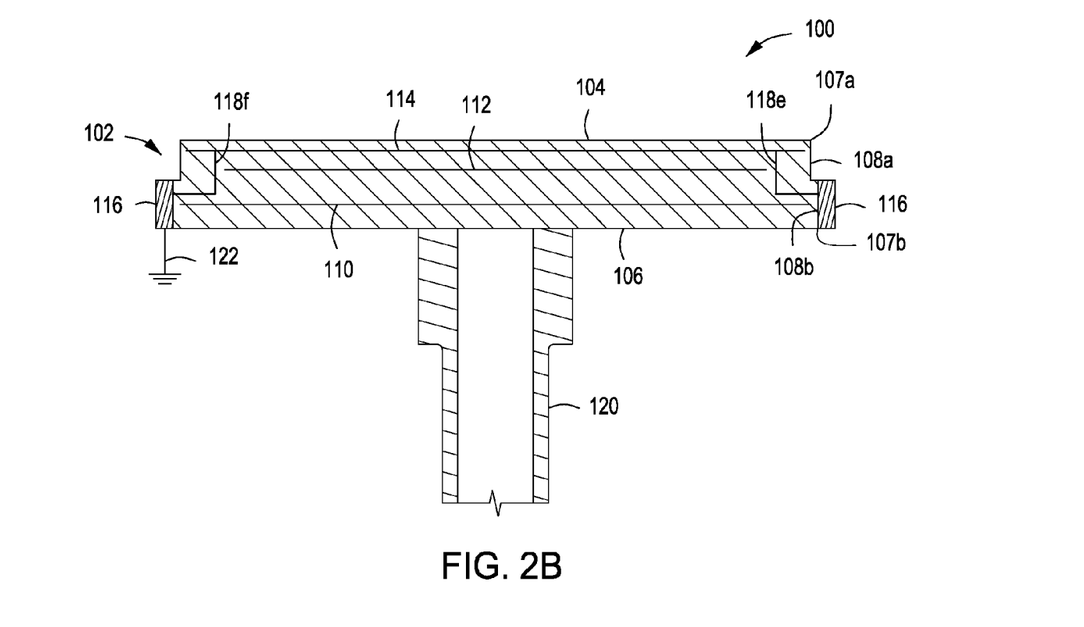
FIG. 2B depicts a sectional view of a ceramic heater pedestal of FIG. 1 taken along line II-II in accordance with some embodiments of the present invention.
Figure 2C:
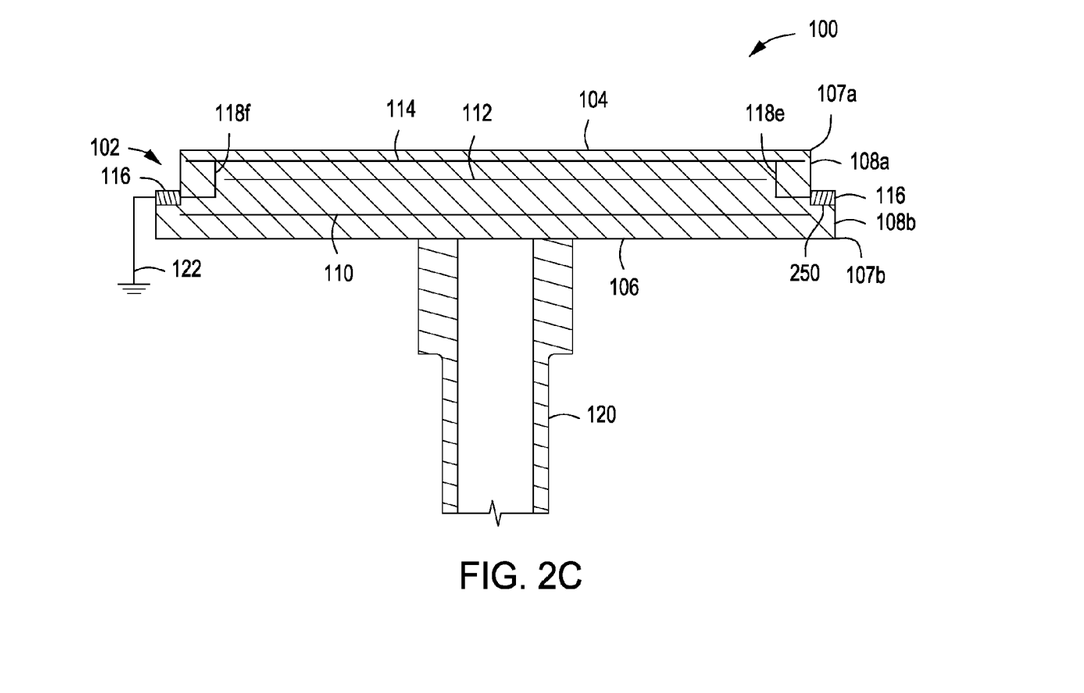
FIG. 2C depicts a sectional view of a ceramic heater pedestal of FIG. 1 taken along line II-II in accordance with some embodiments of the present invention.
Figure 2D:
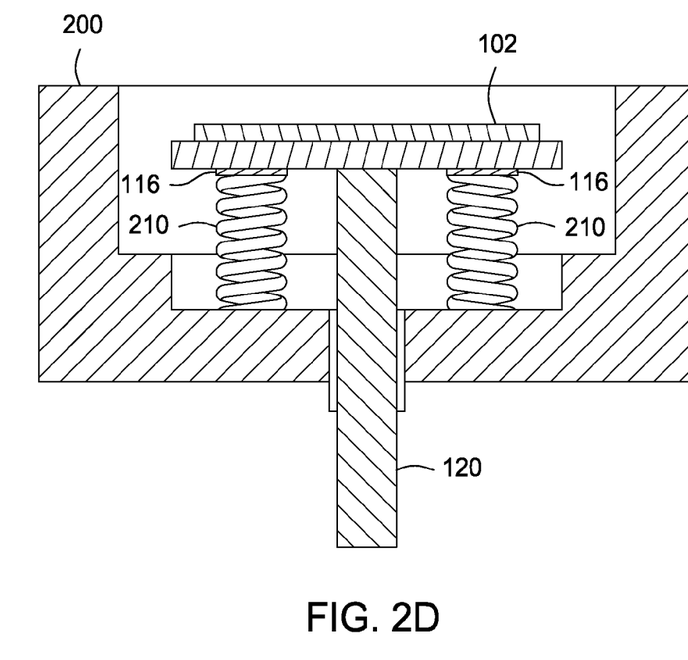
FIGS. 2D-2G depicts sectional views of a process chamber including a ceramic heater pedestal of FIG. 1 in accordance with some embodiments of the present invention.

As illustrated in FIG. 2D, the ground may be provided by the chamber body (200) into which the heater plate 102 is placed. Grounding of the wire mesh may be provided by one or more ground straps (240, FIG. 2E) and/or ground springs 210 (two ground springs shown) between the ground connector 116 and the chamber body 200. The ground strap(s) 240 or ground spring(s) 210 may be formed from appropriate electrically conductive materials, for example, aluminum, stainless steel, or nickel-based alloys, such as Hastelloy®. The ground strap(s) 240 or ground spring(s) 210 may be connected to the ground connector 116, or the chamber body 200, or both the ground connector 116 and the chamber body 200, for example with screws.

Alternately, or in addition, the ground may be provided by components of a process kit. The process kit may include a chamber liner 220, a radio frequency (RF) gasket 230 (FIG. 2E), and a grounded shield or other grounded components (not shown). In the non-limiting embodiment of FIG. 2E, grounding of the wire mesh is provided by one or more ground straps 240 (two shown) between the ground connector 116 and the chamber liner 220. In some embodiments, an RF gasket 230 may be disposed between the chamber liner 220 and the chamber body 200 to provide, among other things, an improved ground connection between the chamber liner 220 and the chamber body 200.

An alternate embodiment offering similar enhanced features is illustrated in FIG. 2B. Similar to the embodiment of 2A, in the embodiment of FIG. 2B, the first heater element 110, second heater element 112 and wire mesh 114 are embedded in the heater plate 102, with first heater element 110 located closest to plate second surface 106, second heater element 112 spaced apart from the first heater element 110 in a direction towards the plate first surface 104, and wire mesh 114 located between the second heater element 112 and the plate first surface 104. Other orientations of the heater elements 110, 112 and wire mesh 114 may be suitable for certain processes or process parameters.

At least one ground connector 116 is mounted to the second perimetrical surface 108b and may be so mounted using conventional hardware, for example threaded fasteners, clamps, or bonding methods. A ground connector 116 may be mounted to the first perimetrical surface 108a in addition to, or in place of, a ground connector mounted to second perimetrical surface 108b. As shown, ground connector 116 is continuous structure, for example an annular structure, affixed to the second perimetrical surface 108b, and may be a ground plate. More than one ground connector 116 may be provided on the second perimetrical surface 108b. The ground connectors may be continuous structures, such as annular rings spaced apart vertically (as illustrated), or the ground connectors may be individual structures, for example segments of an annular ring, or structure of different shapes.

Each ground connector 116 comprises at least one electrical connection with the wire mesh. As illustrated in the non-limiting embodiment of FIG. 2B, the ground connector comprises two electrical connections, indicated schematically by 118e, 118f. In other embodiments, fewer than two connections may be provided, for example one connection. In still other embodiments, more than two connections may be provided, for example 12 or 24 electrical connections between the wire mesh 114 and one or more ground connectors 116 may be provided.

Electrical connections (for example 118e-118f) provide electrical connectivity between the wire mesh 114 and the ground connectors 106, and may be formed from appropriate electrically conductive materials, such as described above.

At a first end adjacent to the wire mesh 114, each electrical connection (e.g., 118e-118f) is electrically connected to the wire mesh 114, as in a non-limiting example, by brazing. The second opposite end of each electrical connection is electrically connected to a ground connector 116, as in non-limiting examples by brazing or through a mechanical connection, for example a crimped connection or with a threaded fastener.

Figure 2E:
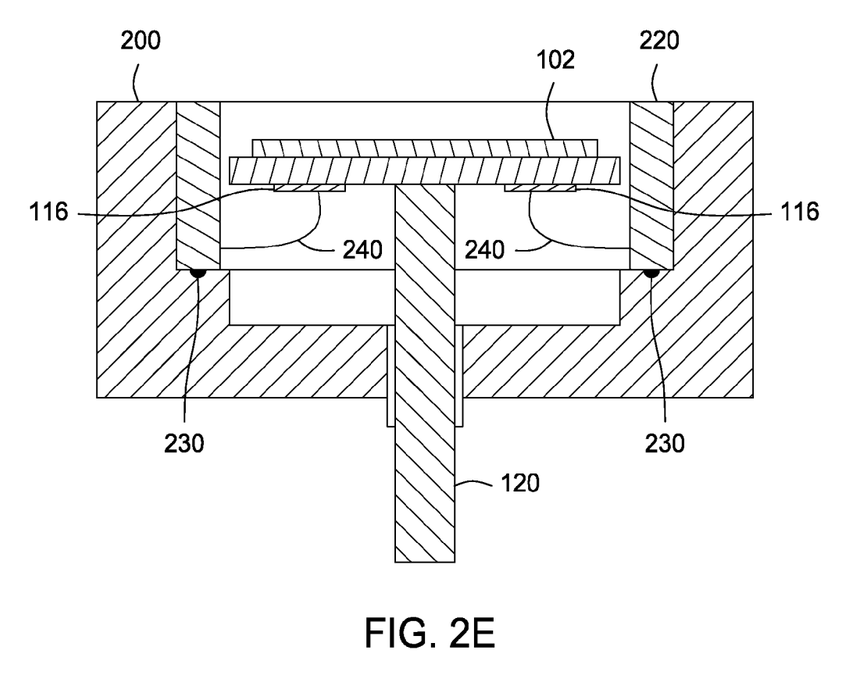

Ground connectors 116 may be electrically connected to an electrical ground, schematically illustrated in FIG. 2B as 122. One or more connections to ground 122 may be provided for each ground connector 116. The ground may be provided by the chamber body (200) with one or more ground straps or ground springs provided between the ground connector 116 and the chamber body 200, similar to the embodiment shown in FIG. 2D. Alternately, or in addition, the ground may be provided by components of a process kit as described above in regard to FIG. 2E. As previously discussed, the process kit may include a chamber liner 220 and an RF gasket 230 as illustrated in FIG. 2E, and may further include a grounded shield or other grounded components.

An alternate embodiment offering enhanced features similar to the above embodiments is illustrated in FIG. 2C. Plate 102 may be of similar construction to the above described embodiments. As illustrated in FIG. 2C, the plate 102 has a ledge surface or ledge 250 formed between, and generally perpendicular to, perimetrical surfaces 108a and 108b. The ledge 250 is also generally mutually parallel with plate first surface 104 and plate second surface 106. At least one ground connector 116 is mounted to the ledge 250 and may be so mounted using conventional hardware, for example threaded fasteners, clamps, or bonding methods. The ground connectors 116 may be constructed in a similar fashion to those described above, for example, the ground connectors 116 may be annular rings, segments of annular rings, or may be individual pieces of different shapes.

As in the embodiments described above, each ground connector 116 has at least one electrical connection with the wire mesh 114, the electrical connections illustrated schematically as 118e and 118f in FIG. 2C. Two electrical connections 118e and 118f are shown. More than two connections may be provided, for example 12 or 24 electrical connections, between the wire mesh 114 and the one or more ground connectors 116. Fewer than two connections, for example one connection, may also be provided.

Electrical connections (for example 118e and 118f) in FIG. 2C may be similar in construction and function as those described above. First and second ends of the electrical connections 118e, 118f may be connected to the wire mesh 114 and the ground connectors 116 as described above Ground connectors 116 may be electrically connected to an electrical ground, schematically illustrated in FIG. 2C as 122. One or more connections to ground 122 may be provided for each ground connector 116.

Figure 2F:
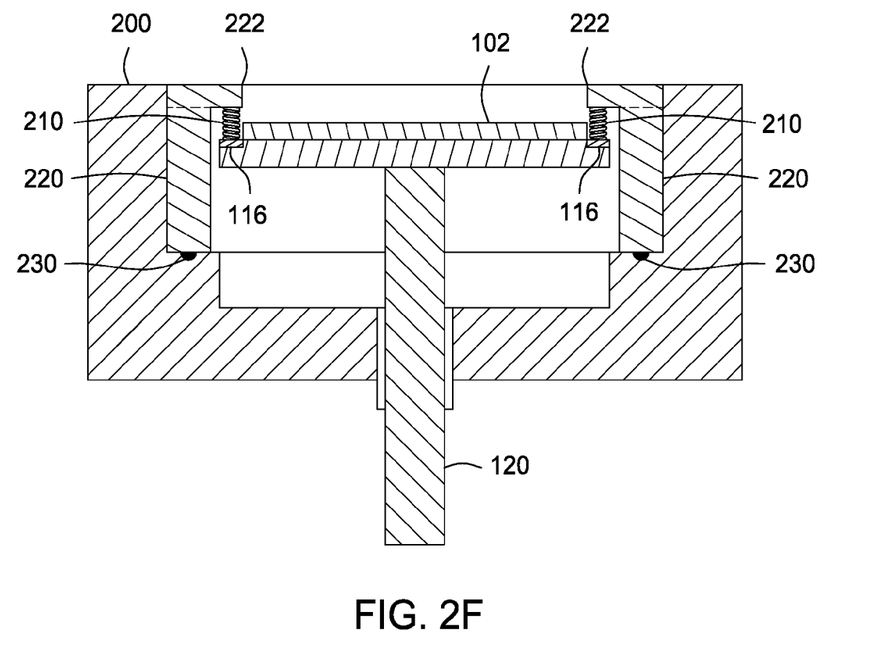
Figure 2G:
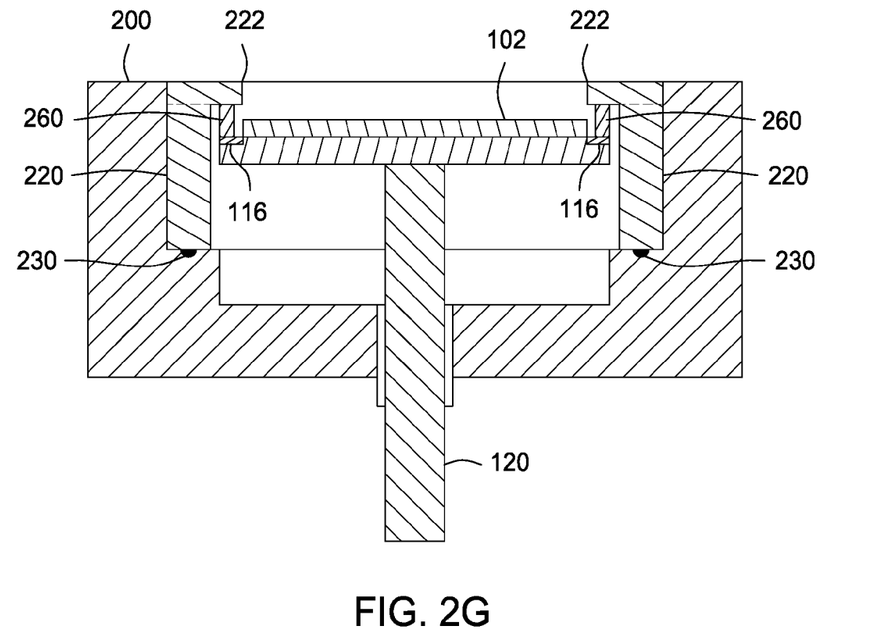

The heater plate 102 of FIG. 2C may be mounted within a chamber body 200 as illustrated in FIGS. 2F and 2G. In the non-limiting embodiment of FIGS. 2F and 2G, the grounding of the wire mesh 114 may be provided by a chamber liner 220 (a constituent of a process kit as described above) placed within the chamber body 200. In the non-limiting embodiment illustrated, the chamber liner 220 includes one or more inwardly projecting ledges 222 which may be formed integrally with the chamber liner 220 or may be formed as a separate piece and attached to the chamber liner 220. The one or more inwardly projecting ledges 222 may be a single annular ledge, or a plurality of inwardly projecting ledges disposed periodically about the central axis of the chamber in locations corresponding to where the ground connection is to be provided.

Grounding of the wire mesh may be provided by one or more ground springs 210 (two shown in FIG. 2F) or one or more ground spring loops 260 (two shown schematically in FIG. 2G) between the ground connector 116 and the one or more inwardly projecting ledges 222 of the chamber liner 220. More than two ground springs 210 or ground spring loops 260 may be used, for example, 4 or 24 ground springs 210 or ground spring loops 260 spaced about the perimeter of the plate 102 may be used. The ground springs 210 may be formed as described above.

The ground spring loop 260 may be a closed loop (e.g., a circle, oval, or other closed shape) formed from appropriate electrically conductive materials, for example, aluminum, stainless steel, or nickel-based alloys, such as Hastelloy®. The ground spring loop(s) 260 may be connected to the chamber liner 220, for example with screws. Electrical communication may be established between the ground connector(s) 116 and the ground spring loop(s) 260, for example, by positioning the plate 102 sufficiently close to the ground spring loops 260 to establish contact between the ground connector(s) 116 and the ground spring loop(s) 260.

The ground spring loops 260 deflect, for example into an oval shape, under a load created when the ground connector(s) 116 and the ground spring loop(s) 260 are brought into contact.

In configuring the heater plate as illustrated in FIGS. 2A and 2B, the inventors have discovered that plasma can be better contained above the substrate support as compared to conventional substrate supports. Beneficial results have been realized in forming the plate 102 with the wire mesh 114 adjacent to the plate first surface 104, i.e., the substrate support surface, and providing multiple ground paths between the wire mesh 114 and ground 122. Additional beneficial results have been realized in plates with multiple connections between the mesh and ground. Other benefits have been realized in plates in which the wire mesh is located proximate to the plate first surface, for example, between 0.5 mm and 3 mm from the first surface 104. Still other benefits have been realized in plates in which the wire mesh is located between 1.5 mm and 2.0 mm from the first surface 104. One benefit of placing the wire mesh adjacent the plate first surface and providing multiple ground connections is enhanced plasma creation, particularly in high frequency plasma applications, that is at frequencies above 13.56 MHz, without negatively affecting the plasma creation at frequencies below 13.56 MHz. An additional benefit of such a construction is enhanced plasma control and containment at all frequencies.

The inventors have found that in low frequency plasma applications, for example below 13.56 MHz, a single ground path for the wire mesh may be sufficient for creation of uniform plasma. However, in plasma applications above 13.56 MHz, a single ground path is not sufficient for creating uniform plasma or containing the plasma created. The present invention, with a plasma-containing wire mesh 114 proximate the plate first surface 104, and with multiple electrical connections (e.g., 118a-118d or 118e-118f) to ground connectors 116 and connections to ground 122, provides, among other things, improved plasma containment capability for a large range of plasma frequencies, for example from 350 kHz through 120 MHz.

Fabrication of heater plates according to the embodiments of the present invention also provides benefits over current ceramic heater plates. In current manufacturing processes, heater plates are fabricated by bonding two separate plates together to form the finished plate. The bonding step in the existing processes increased manufacturing difficulties and production expense.

In contrast, some embodiments of the present invention provide a single piece, monolithic, ceramic heater plate. In the presently disclosed inventive method, at least one wire mesh 114 and at least one heater element 110 (or 112) are placed in a sintering mold. The mold comprises at least a cavity or cavity portions properly configured to form a ceramic heater plate. Ceramic powder, with or without additives, is added to the mold in an appropriate amount. The mold and powder processed according to generally accepted good sintering manufacturing practices. Sintering practices may include pressing the powder to form a green body, processing the green body, for instance, machining details, and sintering in a sintering furnace to fuse the ceramic powder particles together. Upon completion of the sintering process, the finished sintered ceramic heater plate is removed from the furnace for further processing as necessary. The current method of sintering the plate with the heater element and wire mesh included in the plate eliminates at least the difficulties and expense of the bonding step as required in the current manufacturing scheme.

Figure 3:
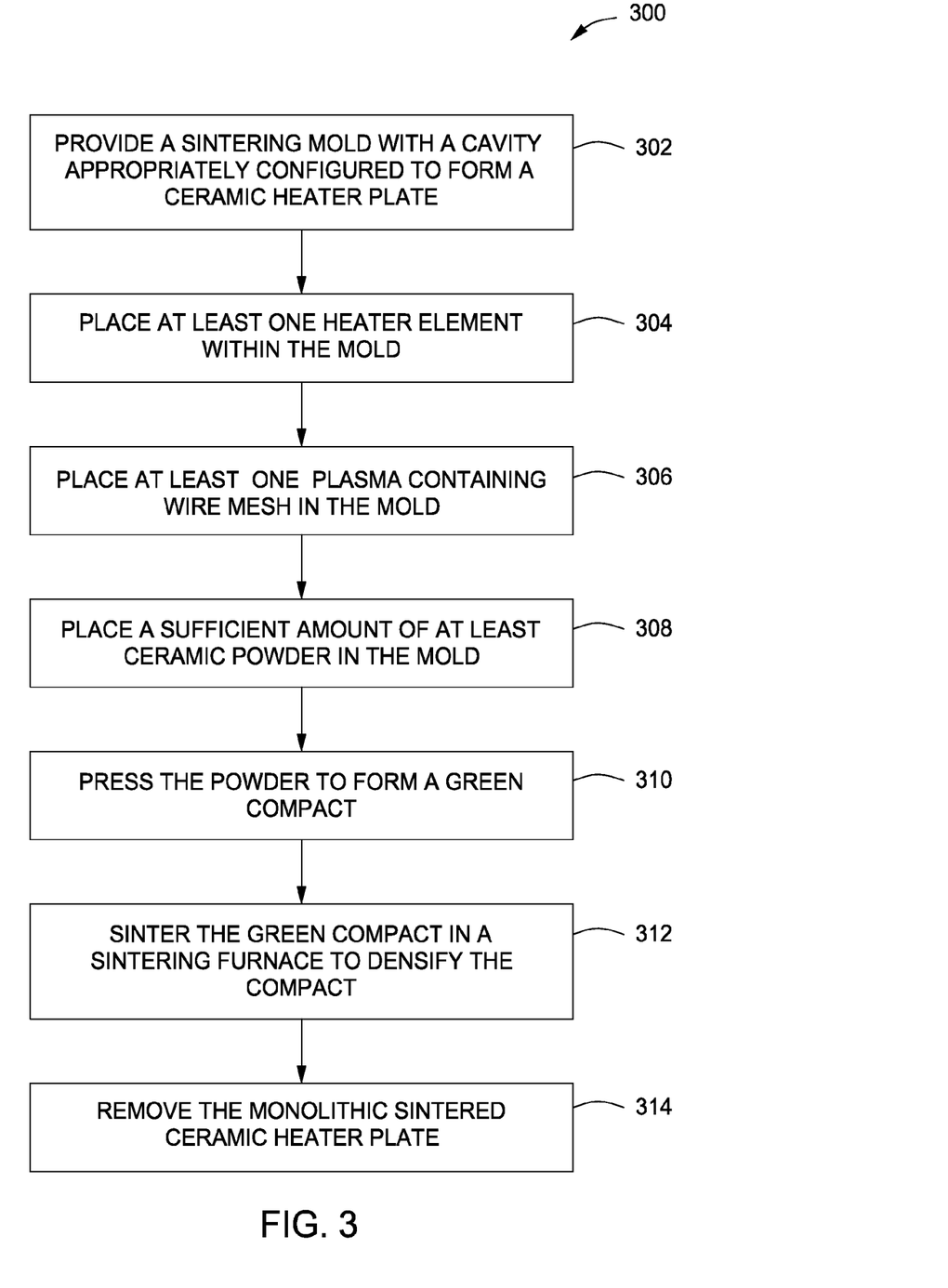
FIG. 3 depicts a flow chart for a method for forming a ceramic heater plate in accordance with some embodiments of the present invention.

For example, FIG. 3 depicts a flow chart for a method 300 for forming a ceramic heater plate in accordance with some embodiments of the present invention. The method 300 begins at 302, where a suitable shaped sintering mold is provided with at least a portion of a cavity suitably shaped to produce the desired ceramic heater plate.

At 304, at least one heater element is added to the mold for sintering within the plate. The at least one heater element may be fixtured within the mold.

At 306, at least one wire mesh with characteristics conducive to controlling plasma is added to the mold. The wire mesh may be fixtured within the mold, or may be fixtured by spacers or attachment device to the heater element(s).

At 308, at least ceramic powder is introduced to the mold in sufficient quantity to form the desired ceramic heater plate. In addition the ceramic powder, appropriate additives, for example binders, may be introduced to the mold.

At 310, the powder, the heater element(s), and the wire mesh are subjected to pressure to form a green body or an unsintered article. The unsintered article may be sufficiently durable to withstand processing, such as machining, as necessary to form details not adequately provided in the pressing step.

The green body formed at 310 is then placed in a sintering furnace for processing at 312. The processing may include heating the green body at different temperatures and/or pressures for periods of time to fuse the powder and form a solid article.

Following sintering, the one-piece, monolithic heater plate is removed from the furnace at 314. The ceramic article may be further processed by, for example, machining operations, to produce the final ceramic heater plate.

Pedestal shaft 120 may be sintered concurrently with the heater plate or may separately undergo a similar sintering process as outlined above and in FIG. 3 and joined to the plate 102 in a secondary operation.

Thus, embodiments of a ceramic heater pedestal with wire mesh plasma containment that may provide beneficial results in one or more of plasma creation and plasma containment for plasma frequencies ranging from low frequency (350 kHz) to high frequency (120 MHz) have been provided herein. Also provided is an exemplary method for making same.

While the foregoing is directed to embodiments of the present invention, other and further embodiments of the invention may be devised without departing from the basic scope thereof.

The invention claimed is:

1. A substrate support, comprising: a heater plate comprising a first surface, an opposing second surface, a thickness bounded by the first and second surfaces, and a first perimetrical surface; a first heater element disposed between the first and second surfaces; a wire mesh disposed between the first and second surfaces; a ground connector mounted to a surface of the heater plate; at least one electrical connection between the wire mesh and the ground connector; and an elongated shaft comprising a first end and an opposite second end, wherein the heater plate second surface is mounted to the first end of the shaft, wherein the ground connector comprises an annular ground plate.

2. A substrate support, of claim 1, wherein the heater plate is a monolithic sintered plate.

3. The substrate support of claim 2, wherein the first heater element is sintered in place in the heater plate.

4. The substrate support of claim 3, further comprising a second heater element sintered in place in the heater plate.

5. The substrate support of claim 2, wherein the wire mesh is sintered in place in the heater plate.

6. The substrate support of claim 5, wherein the wire mesh is located adjacent the first surface and the first heater element.

7. The substrate support of claim 1, wherein the ground connector is mounted on the heater plate second surface.

8. The substrate support of claim 1, further comprising:
one or more additional ground connectors, each ground connector comprising an annular ground plate; and
at least one electrical connection between the wire mesh and each additional ground connector.

9. The substrate support of claim 1, wherein the ground connector is mounted on the first perimetrical surface.

10. The substrate support of claim 9, wherein the ground connector comprises a segment of an annulus.

11. The substrate support of claim 10, further comprising:
one or more additional ground connectors, each ground connector comprising an annular segment; and
at least one electrical connection between the wire mesh and each additional ground connector.

12. The substrate support of claim 1, wherein the first perimetrical surface bounds the first surface, the substrate support further comprising:
a second perimetrical surface bounding the second surface; and
a ledge surface formed between the first perimetrical surface and the second perimetrical surface;
wherein the ground connector is mounted on the ledge surface.

13. A process chamber comprising:
a grounded chamber body having the substrate support of claim 1 disposed therein, wherein the ground connector is electrically coupled to the chamber body via a conductor.

14. The process chamber of claim 13 wherein the conductor comprises at least one of a ground spring, a ground strap, or a ground loop.

15. A process chamber comprising:
a grounded chamber body having the substrate support of claim 1 disposed therein; and
a conductive liner disposed within and electrically coupled to the grounded chamber body;
wherein the ground connector is electrically coupled to the conductive liner via a conductor.

16. The process chamber of claim 15 wherein the conductor comprises at least one of a ground spring, a ground strap, or a ground loop.

* * * * *

UNITED STATES PATENT AND TRADEMARK OFFICE
CERTIFICATE OF CORRECTION

| | | |
|---|---|---|
| PATENT NO. | : 9,478,447 B2 | Page 1 of 1 |
| APPLICATION NO. | : 13/684672 | |
| DATED | : October 25, 2016 | |
| INVENTOR(S) | : Olkan Cuvalci et al. | |

It is certified that error appears in the above-identified patent and that said Letters Patent is hereby corrected as shown below:

In the Claims

The phrase "A substrate support, of claim 1" recited in Claim 2, Column 8, Line 62, should be replaced with the phrase "The substrate support of claim 1."

Signed and Sealed this
Twenty-fifth Day of April, 2017

Michelle K. Lee
*Director of the United States Patent and Trademark Office*